United States Patent
Wen et al.

(10) Patent No.: US 10,566,986 B2
(45) Date of Patent: Feb. 18, 2020

(54) CONVERTING MODULE AND CONVERTING CIRCUIT

(71) Applicant: SHENZHEN GOODIX TECHNOLOGY CO., LTD., Guangdong (CN)

(72) Inventors: Ya-Nan Wen, Taipei (TW); Yingsi Liang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/179,405

(22) Filed: Nov. 2, 2018

(65) Prior Publication Data

US 2019/0074843 A1 Mar. 7, 2019

Related U.S. Application Data

(63) Continuation of application No. PCT/CN2017/096472, filed on Aug. 8, 2017.

(51) Int. Cl.
  *H03M 1/08* (2006.01)
  *H03M 3/00* (2006.01)

(52) U.S. Cl.
  CPC .............. *H03M 1/08* (2013.01); *H03M 3/424* (2013.01); *H03M 3/456* (2013.01)

(58) Field of Classification Search
  CPC .......... H03M 1/08; H03M 3/424; H03M 3/45; H03M 3/452; H03M 3/454; H03M 3/456; H03M 3/462
  USPC ................................. 341/143–155
  See application file for complete search history.

(56) References Cited

U.S. PATENT DOCUMENTS

| | | | |
|---|---|---|---|
| 7,068,197 B1 * | 6/2006 | Tsyrganovich | ....... H03M 3/344 341/143 |
| 7,158,566 B2 | 1/2007 | Dowling | |
| 7,405,687 B2 * | 7/2008 | Mitteregger | ............ H03M 3/37 341/143 |
| 7,978,113 B2 | 7/2011 | Kulchycki | |

(Continued)

FOREIGN PATENT DOCUMENTS

| | | |
|---|---|---|
| CN | 103329444 A | 9/2013 |
| CN | 103701465 A | 4/2014 |
| CN | 104581589 A | 4/2015 |

OTHER PUBLICATIONS

English Abstract Translation of CN103329444A.

(Continued)

*Primary Examiner* — Lam T Mai
(74) *Attorney, Agent, or Firm* — WPAT, P.C., Intellectual Property Attorneys; Anthony King

(57) ABSTRACT

The present disclosure provides a converting module formed in a first die. The first die is coupled to a bus having a bus bit width. The converting module includes an analog-to-digital converter, configured to generate a first digital signal having a first bit width different from the bus bit width; and a sigma-delta modulator, coupled to the analog-to-digital converter, and configured to generate a second digital signal according to the first digital signal. The second digital signal has a bit width equal to the bus bit width. The sigma-delta modulator includes a filter and a quantizer. The number of bits outputted by the quantizer is equal to the bus bit width.

18 Claims, 6 Drawing Sheets

(56) References Cited

U.S. PATENT DOCUMENTS

| | | | |
|---|---|---|---|
| 9,326,733 B2* | 5/2016 | Kim | A61B 5/7207 |
| 9,742,430 B1* | 8/2017 | Barrenscheen | H03M 3/462 |
| 10,033,401 B2* | 7/2018 | Marker-Villumsen | H03M 1/004 |
| 2004/0193665 A1* | 9/2004 | Mallinson | H03H 17/0248 708/300 |
| 2005/0122241 A1 | 6/2005 | Magrath | |
| 2009/0296858 A1* | 12/2009 | Nozawa | H03M 1/0665 375/332 |
| 2012/0280843 A1* | 11/2012 | Tsai | H03M 3/37 341/110 |
| 2016/0173120 A1* | 6/2016 | Doare | H03M 3/378 341/120 |
| 2016/0309274 A1 | 10/2016 | Ma et al. | |
| 2019/0123762 A1* | 4/2019 | Bach | H03M 3/414 |
| 2019/0199559 A1* | 6/2019 | Wang | H04L 25/4906 |

OTHER PUBLICATIONS

English Abstract Translation of CN103701465A.
English Abstract Translation of CN104581589A.
International Search Report of PCT/CN2017/096472.
Search Report dated Jun. 25, 2019 issued by European Patent Office for counterpart application 17908100.5.

* cited by examiner

CONVERTING MODULE AND CONVERTING CIRCUIT

CROSS-REFERENCE TO RELATED APPLICATIONS

The present disclosure is a continuation of international application No. PCT/CN2017/096472 filed on Aug. 8, 2017, of which is hereby incorporated by reference in its entirety.

TECHNICAL FIELD

The present disclosure relates to converting modules and converting circuits, and in particular, to converting modules and converting circuits capable of converting a bit width.

BACKGROUND

An integrated circuit of an electronic product may be divided into an analog circuit and a digital circuit. As the efficiency of the analog circuit is associated with the physical area of the actual circuit, the analog circuit may be manufactured using mature processes with lower cost or unit price. On the other hand, the digital circuit may be manufactured using more advanced processes, or using processes with smaller minimum line spacings or minimum line widths. In other words, the analog circuit and the digital circuit of the electronic product can be implemented on two or more than two different dies, or bare dies, respectively. The different dies are coupled or electrically connected to each other through the bus.

However, an output signal of some circuit modules of the die including the analog circuit, referred to as an analog die for short, may have a signal specification different from that of a signal which can be carried by the bus. In the existing art, it is necessary to modify the signal specification of the output signal of such circuit modules of the analog die so as to meet the signal specification for the bus, causing trouble and inconvenience in designing circuits. The circuit modules, besides, cannot be effectively utilized. In view of the foregoing, there is a need for improvement in the related art.

SUMMARY

Therefore, a main object of some embodiments of the present disclosure is to provide converting modules and converting circuits capable of converting a bit width, so as to overcome the drawbacks of the prior art.

In order to resolve the above issues, the present disclosure provides a converting module. The first die is formed in a first die. The first die is coupled to a bus. The bus has a bus bit width. The converting module comprises an analog-to-digital converter, configured to generate a first digital signal, wherein the first digital signal has a first bit width different from the bus bit width; and a sigma-delta modulator, coupled to the analog-to-digital converter, the sigma-delta modulator configured to generate a second digital signal according to the first digital signal, wherein the second digital signal has a bit width equal to the bus bit width, the sigma-delta modulator comprises a filter and a quantizer, and a number of bits outputted by the quantizer is equal to the bus bit width.

Preferably, the first die is coupled to a second die through the bus.

Preferably, a sampling rate of the analog-to-digital converter is equal to a Nyquist rate, a noise transfer function of the filter is expressed as $$\frac{z^2 + (g-2)z + 1}{z^2 + (g-2+a_1+a_2)z + 1 - a_2},$$

a signal transfer function of the filter is expressed as $$\frac{b_3 z^2 + (gb_3 - 2b_3 + b_2 + b_1)z + (b_3 - b_2)}{z^2 + (g-2+a_1+a_2)z + 1 - a_2},$$

and $a_1$, $a_2$, $b_1$, $b_2$, $b_3$ and g are filter coefficients of the filter.

Preferably, a sampling rate of the analog-to-digital converter is greater than a Nyquist rate, a noise transfer function of the filter is expressed as a $$\frac{z^2 - 1}{z^2 + a_2 z + a_1 - a_2},$$

a signal transfer function of the filter is expressed as $$\frac{b_3 z^2 + b_2 z - b_3 - b_2 + b_1}{z^2 + a_2 z + a_1 - a_2},$$

and $a_1$, $a_2$, $b_1$, $b_2$ and $b_3$ are filter coefficients of the filter.

Preferably, the converting module further comprises a rate converter, wherein the rate converter is coupled to the sigma-delta modulator.

Preferably, the rate converter is coupled between the analog-to-digital converter and the sigma-delta modulator; the rate converter receives the first digital signal having a first bit rate, and converts the first digital signal into a third digital signal having a second bit rate; and the sigma-delta modulator receives the third digital signal and generates the second digital signal having the second bit rate.

Preferably, the sigma-delta modulator receives the first digital signal and generates the second digital signal; the rate converter is coupled between the sigma-delta modulator and the bus; the rate converter receives the second digital signal, and converts the second digital signal having a first bit rate into a fourth digital signal having a second bit.

Preferably, the rate converter is an up-sampler.

Preferably, the rate converter is a down-sampler.

The present disclosure further provides a converting circuit. The converting circuit comprises a bus, having a bus bit width; a first die, fabricated by a first process, wherein the first die comprises: an analog-to-digital converter, configured to generate a first digital signal, wherein the first digital signal has a first bit width different from the bus bit width; and a sigma-delta modulator, coupled to the analog-to-digital converter, the sigma-delta modulator configured to generate a second digital signal according to the first digital signal, wherein the second digital signal has a bit width equal to the bus bit width, the sigma-delta modulator comprises a filter and a quantizer, and a number of bits outputted by the quantizer is equal to the bus bit width; and a second die, fabricated by a second process, wherein the second die is coupled to the first die through the bus.

The present disclosure uses the sigma-delta modulator to convert the bit width, uses the rate converter to convert the bit rate, and properly designs the filter within the sigma-delta modulator to suppress the noise effectively. As a result, the present disclosure can effectively reduce the noise energy within the signal band, maintain a better signal-to-noise ratio, and solve the issue of inconsistent signal specifications in the prior art.

DETAILED DESCRIPTION

The detailed description provided below in connection with the appended drawings is intended as a description of the present examples so that so that those skilled in the art may better understand the purposes, technical solutions, and advantages of the present application. It should be noted that the embodiments of the present application are provided for illustrative purposes, and are not limiting.

In the present disclosure and the claims, the term "coupled" refers to any direct or indirect means for electrical connection, whereas the term "electrically connected" refers to a direct electric connection.

Figure 1:
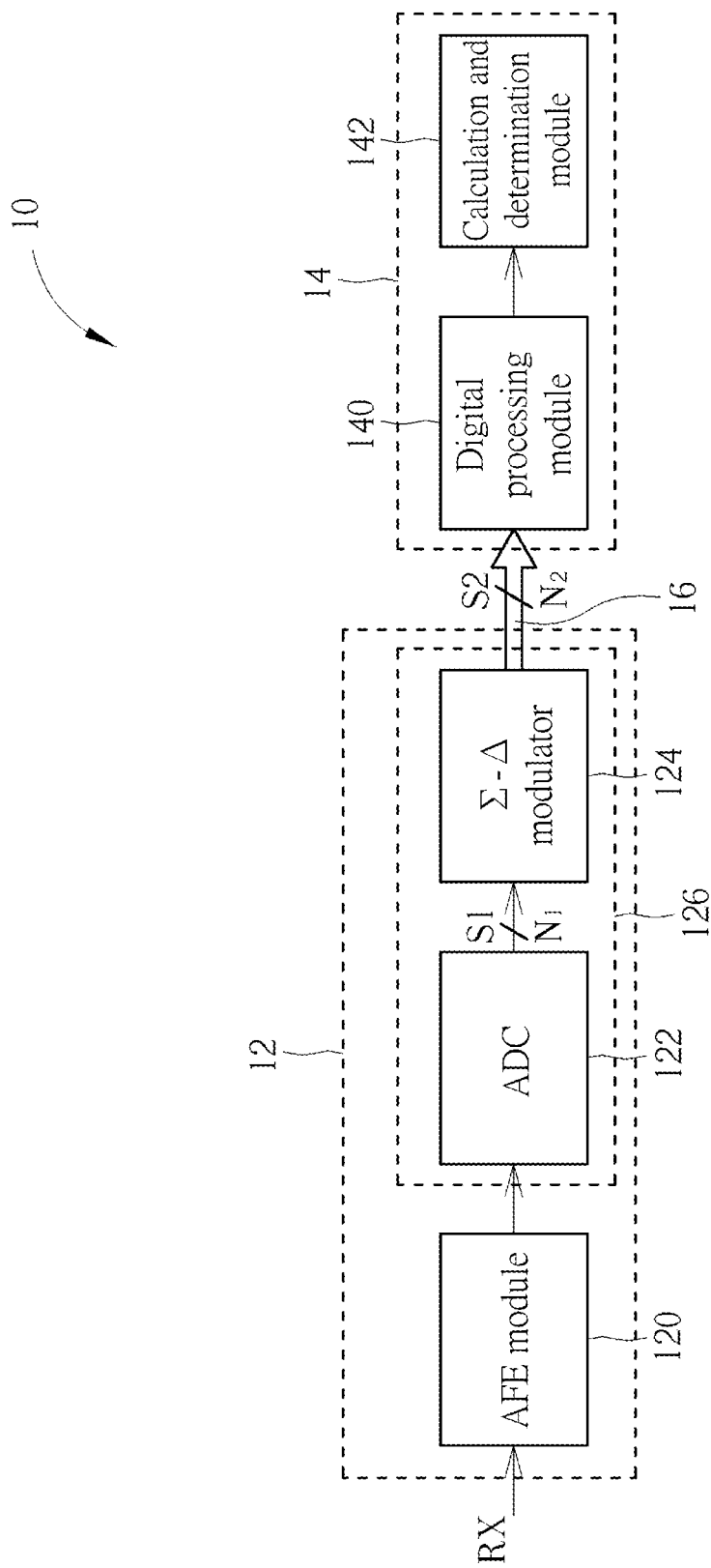
FIG. 1 is a schematic view of a converting circuit according to one embodiment of the present disclosure.

Reference is made to FIG. 1, which is a schematic view of a converting circuit 10 according to embodiments of the present disclosure. The converting circuit 10 comprises an analog circuit and a digital circuit, wherein the efficiency of the analog circuit of the converting circuit 10 is associated with the physical area of the actual circuit, and hence the analog circuit of the converting circuit 10 may be manufactured using mature processes with lower cost/unit price; whereas the digital circuit of the converting circuit 10 may be manufactured using more advanced processes or processes with smaller minimum line spacings (or minimum line widths). In other words, the analog circuit and the digital circuit of the electronic device 10 can be implemented on two or more than two different dies, respectively.

Specifically, the converting circuit 10 may comprise a first die 12, a second die 14 and a bus 16, wherein the first die 12 and the second die 14 are coupled (or electrically connected) to each other via the bus 16. In one embodiment, the first die 12 may be manufactured using a 0.18-μm process, whereas the second die 14 may be manufactured using a 55-nm process. The first die 12 comprises primarily the analog circuit of the converting circuit 10, wherein the analog circuit comprises an analog front end (AFE) module 120 and a converting module 126. The converting module 126 comprises an analog-to-digital converter (ADC) 122 and a sigma-delta (Σ-Δ) modulator 124. The second die 14 comprises primarily the digital circuit of the converting circuit 10. In one embodiment, the second die 14 may comprise a digital processing module 140, and a calculation and determination module 142. In one embodiment, the digital processing module 140 may comprise digital circuits, such as a digital filter, a digital amplifier, a digital mixer and a digital integrator, and the calculation and determination module 142 may, based on an output of the digital processing module 140, perform calculation or determination operations associated with the operation of the converting circuit 10. For example, when the converting circuit 10 is applied to a touch panel, the calculation and determination module 142 can be used to determine a touch event associated with the touch panel. In other words, the AFE module 120 receives a signal RX, and the converting circuit 10 determines the touch event associated with the touch panel according to the signal RX, wherein the signal RX described herein is a sense signal detected by sense electrodes of the touch panel.

It should be noted that a first digital signal S1 outputted by the ADC 122 may have a specification different from that of a digital signal carried by the bus 16. Embodiments of the present disclosure can use the sigma-delta modulator 124 in the converting module 126 to convert the specification of the first digital signal S1 into a specification applicable to the bus 16. Specifically, the first digital signal S1 outputted by the ADC 122 may have a bit width $N_1$, whereas the bus 16 may have a bus bit width $N_{BUS}$. In a case where the bit width $N_1$ is greater than the bus bit width $N_{BUS}$, if the first digital signal S1 having the bit width $N_1$ is directly sent to the bus 16 having the bus bit width $N_{BUS}$, loss of signal fidelity would occur because $N_1 > N_{BUS}$. With the use of the sigma-delta modulator 124, the bit width $N_1$ of the first digital signal S1 can be converted into a bit width $N_2$ that is equal to the bus bit width $N_{BUS}$ (i.e. $N_2 = N_{BUS}$). In other words, the sigma-delta modulator 124 may output a second digital signal S2 having the bus bit width $N_{BUS}$ according to the first digital signal S1 having the bit width $N_1$, so as to prevent the loss of signal fidelity.

Figure 2:
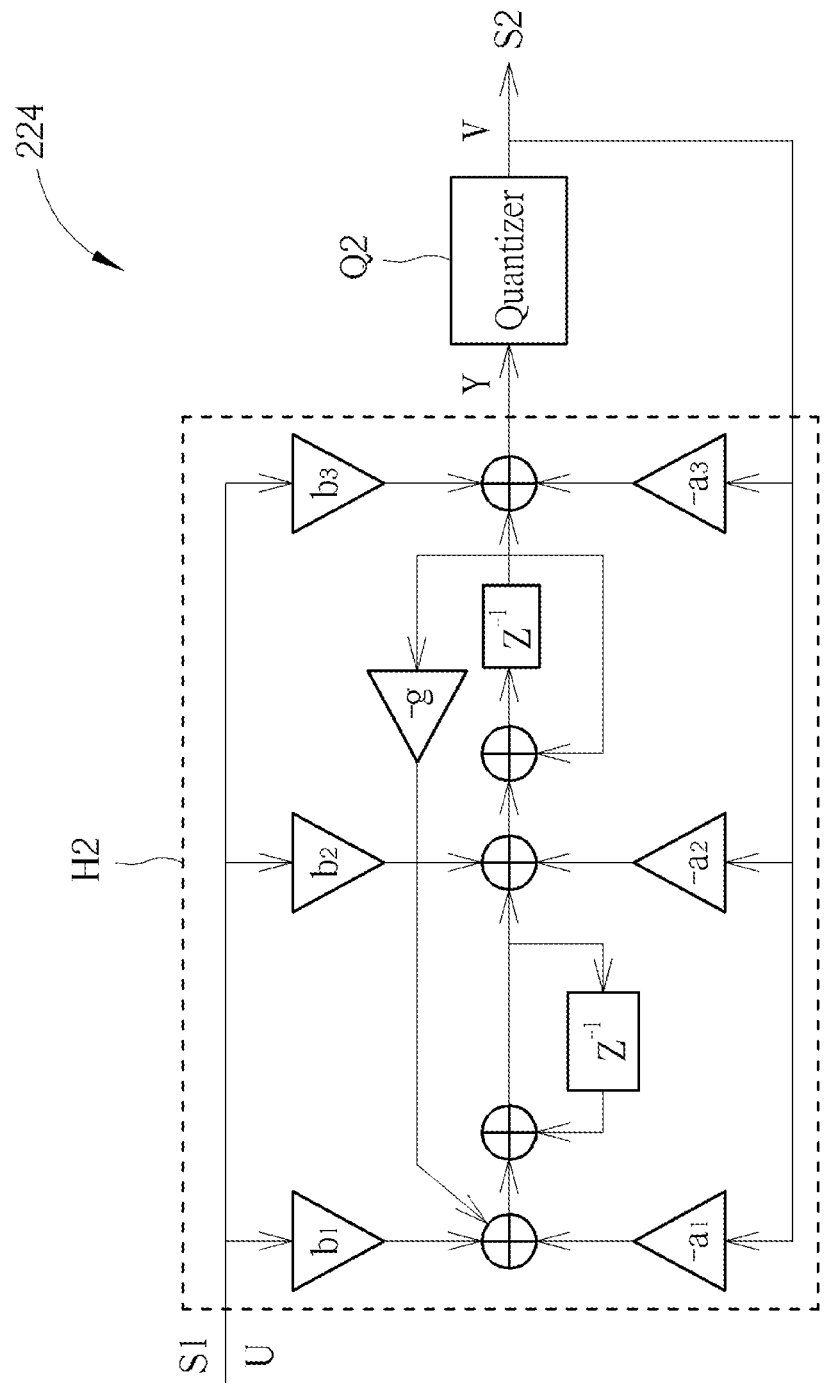
FIG. 2 is a schematic view of a sigma-delta modulator according to one embodiment of the present disclosure.

For example, reference is now made to FIG. 2, which is a schematic view of a sigma-delta modulator 224 according to embodiments of the present disclosure. The sigma-delta modulator 224 may be used to implement the sigma-delta modulator 124 in the converting module 126, wherein a sampling rate of the ADC 122 in the converting module 126 corresponds to a Nyquist rate of the signal RX. The sigma-delta modulator 224 comprises a filter H2 and a quantizer Q2. The quantizer Q2 is an $N_2$-bit quantizer, and the number of bits outputted by the quantizer Q2, or a bit number $N_2$, is equal to the bus bit width $N_{BUS}$ (i.e. $N_2 = N_{BUS}$). In the embodiment illustrated in FIG. 2, the filter H2 is a second-order filter. Specifically, in one embodiment, the filter H2 may have a noise transfer function (NTF):

$$\frac{V(z)}{E(z)} = \frac{z^2 + (g-2)z + 1}{z^2 + (g - 2 + a_1 + a_2)z + 1 - a_2},$$

and have a signal transfer function (STF):

$$\frac{Y(z)}{U(z)} = \frac{b_3 z^2 + (gb_3 - 2b_3 + b_2 + b_1)z + (b_3 - b_2)}{z^2 + (g - 2 + a_1 + a_2)z + 1 - a_2},$$

wherein $a_1$, $a_2$, $b_1$, $b_2$, $b_3$ and g are filter coefficients of the filter H2. V(z) and Y(z) represent, respectively, the z-domain signal representations corresponding to a signal outputted by the filter H2 and a signal outputted by the quantizer Q2. E(z)

represents the z-domain representation of quantization noise introduced by the quantizer Q2. U(z) represents the z-domain representation of an input signal of the filter H2. Furthermore, in FIG. 2, the coefficient $a_3$ may be 0, or the system does not include the coefficient $a_3$. Furthermore, the coefficients $a_1$, $a_2$, $a_3$, $b_1$, $b_2$, $b_3$ and g may be properly designed, so that the noise frequency spectrum of the quantization noise, which is obtained by performing noise shaping on the quantization noise, falls outside the signal band rather than decreases the signal-to-noise ratio within the signal band to a relatively low level.

In view of the foregoing, when the bit width $N_1$ of the first digital signal S1 outputted by the ADC 122 is greater than the bus bit width $N_{BUS}$, the converting module 126 may use the sigma-delta modulator 224 to convert the first digital signal S1 having the bit width $N_1$ into a second digital signal S2 having the bit width $N_2$, so as to prevent the loss of signal fidelity.

Figure 3:
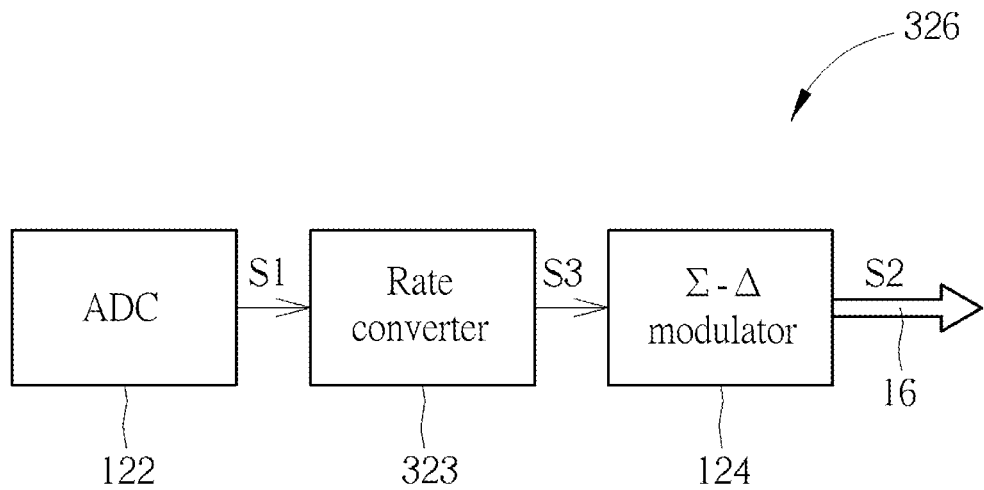
FIG. 3 is a schematic view of a converting module according to one embodiment of the present disclosure.
Figure 4:
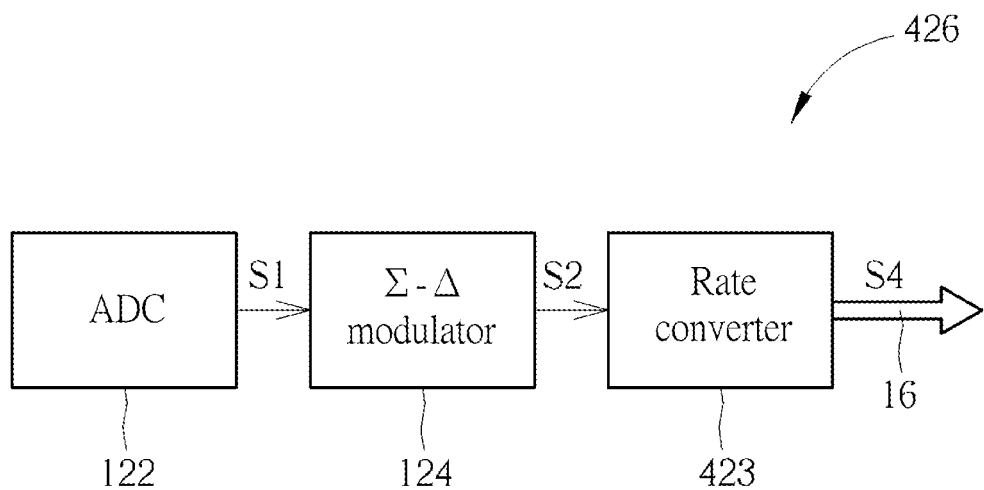
FIG. 4 is a schematic view of a converting module according to another embodiment of the present disclosure.

Furthermore, in addition to changing the bit width of the first digital signal outputted by the analog-to-digital converter, the proposed converting module may also alter the bit rate of the first digital signal outputted by the analog-to-digital converter. Reference is made to FIG. 3 and FIG. 4, which are schematic views of the converting module 326 and the converting module 426, respectively, according to embodiments of the present disclosure. The converting module 326 and the converting module 426 are similar to the converting module 126, and hence, the same components/elements are designated with the same reference numerals. Unlike the converting module 126, the converting module 326 further comprises a rate converter 323, and the converting module 426 further comprises a rate converter 423. Each of the rate converters 323 and 423 is a bit rate converter, which may comprise an up-sampler or a down-sampler. Further description is provided later.

In the converting module 326 illustrated in FIG. 3, the rate converter 323 is coupled (or electrically connected) between the ADC 122 and the sigma-delta modulator 124. The rate converter 323 is configured to convert the first digital signal S1 having the bit width $N_1$ and a bit rate $r_1$ into a third digital signal S3 having the bit width $N_1$ and a bit rate $r_2$. Next, the sigma-delta modulator 124 converts the third digital signal S3 having the bit width $N_1$ and bit rate $r_2$ into the second digital signal S2 having the bit width $N_2$ and bit rate $r_2$, and outputs the second digital signal S2 to the bus 16.

In the converting module 426 illustrated in FIG. 4, the rate converter 423 is coupled (or electrically connected) between the sigma-delta modulator 124 and the bus 16. The sigma-delta modulator 124 is configured to convert the first digital signal S1 having the bit width $N_1$ and the bit rate $r_1$ into a second digital signal S2 having the bit width $N_2$ and the bit rate $r_1$. Next, the rate converter 423 converts the second digital signal S2 having the bit width $N_2$ and bit rate $r_1$ into a fourth digital signal S4 having the bit width $N_2$ and bit rate $r_2$, and outputs the fourth digital signal S4 to the bus 16.

Figure 5:
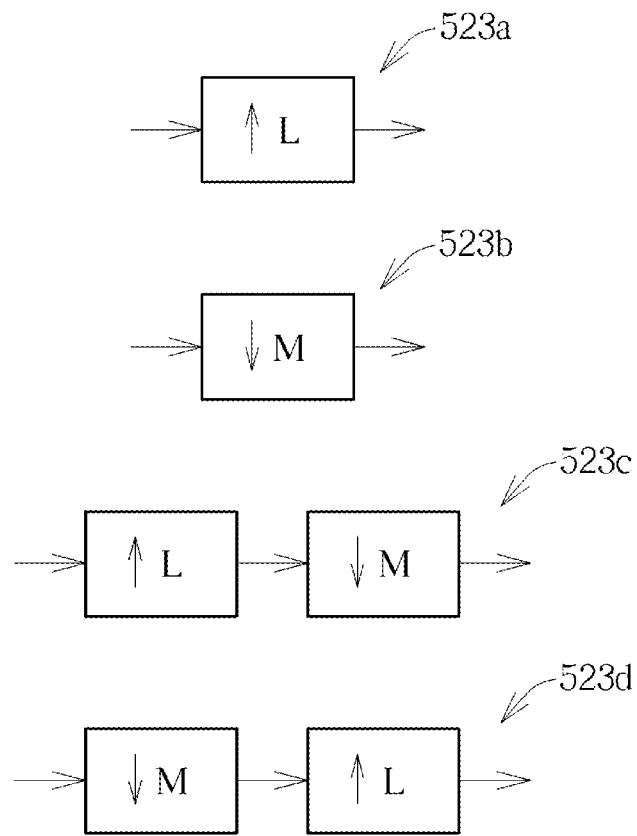
FIG. 5 is a schematic view of a plurality of rate converters according to one embodiment of the present disclosure.

Furthermore, reference is made to FIG. 5, which is a schematic view of the rate converters 523a, 523b, 523c and 523d according to embodiments of the present disclosure. Each of the rate converters 523a, 523b, 523c and 523d may be used to implement the rate converter 323 and 423. In other words, in one embodiment, each of the rate converters 323 and 423 may comprise an up-sampler (e.g. the rate converter 523a), thereby outputting digital signals having the bit rate $r_2$ that is L times the bit rate $r_1$ (i.e. $r_2 = L \times r_1$). In one embodiment, each of the rate converters 323 and 423 may comprise a down-sampler (e.g. the rate converter 523b), thereby outputting digital signals having the bit rate $r_2$ that is (1/M) times the bit rate $r_1$ (i.e. $r_2 = r_1/M$). In one embodiment, the rate converter 323 and 423 may comprise, respectively, an up-sampler and a down-sampler (e.g. rate converters 523c and 523d), thereby outputting the digital signals having the bit rate $r_2$ that is (L/M) times the bit rate $r_1$ (i.e. $r_2 = L \times r_1/M$).

Figure 6:
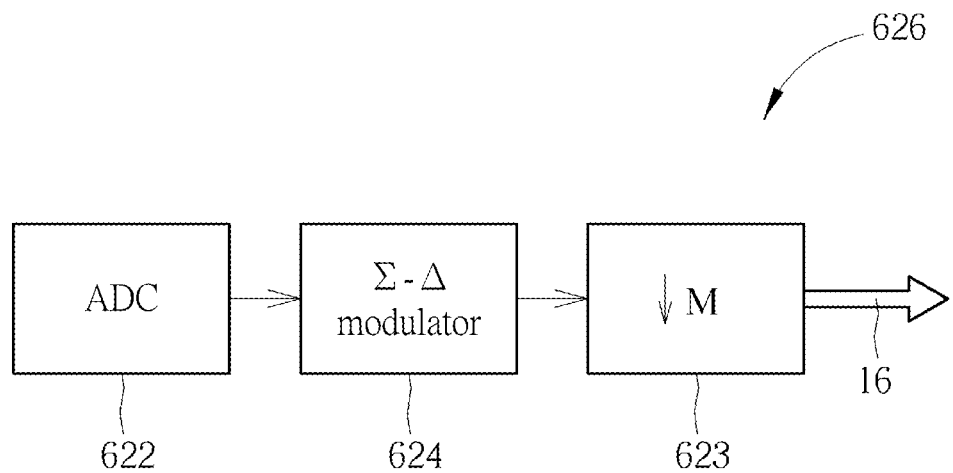
FIG. 6 is a schematic view of a converting module according to yet another embodiment of the present disclosure.

Furthermore, reference is made to FIG. 6, which is a schematic view of a converting module 626 according to embodiments of the present disclosure. The converting module 626 comprises an ADC 622, a sigma-delta modulator 624, and a rate converter 623. In the converting module 626 illustrated in FIG. 6, the rate converter 623 is a down-sampler, wherein the down-sampling rate M of the rate converter 623 may be 2 (M=2). Furthermore, the ADC 622 is a sigma-delta (Σ-Δ) ADC; that is, the ADC 622 is an oversampling ADC. In other words, the sampling rate of the ADC 622 is greater than N times the Nyquist rate corresponding to the signal RX. N can be greater than 5. Preferably, N can be greater than 10. In this case, the bit width $N_2$ of the signal outputted by the sigma-delta modulator may be greater or smaller than the bit width N1 of the signal outputted by the bit width $N_1$ depending on the signal specification of the bus. When the ADC 622 is the oversampling ADC, the rate converter 623 is coupled to the output terminal of the sigma-delta modulator 624. In this way, it is feasible to avoid the aliasing effect associated with the noise frequency spectrum due to the down-sampling operation, and therefore, the decrease in the signal-to-noise ratio of the signal band due to the aliasing effect may be prevented.

Figure 7:
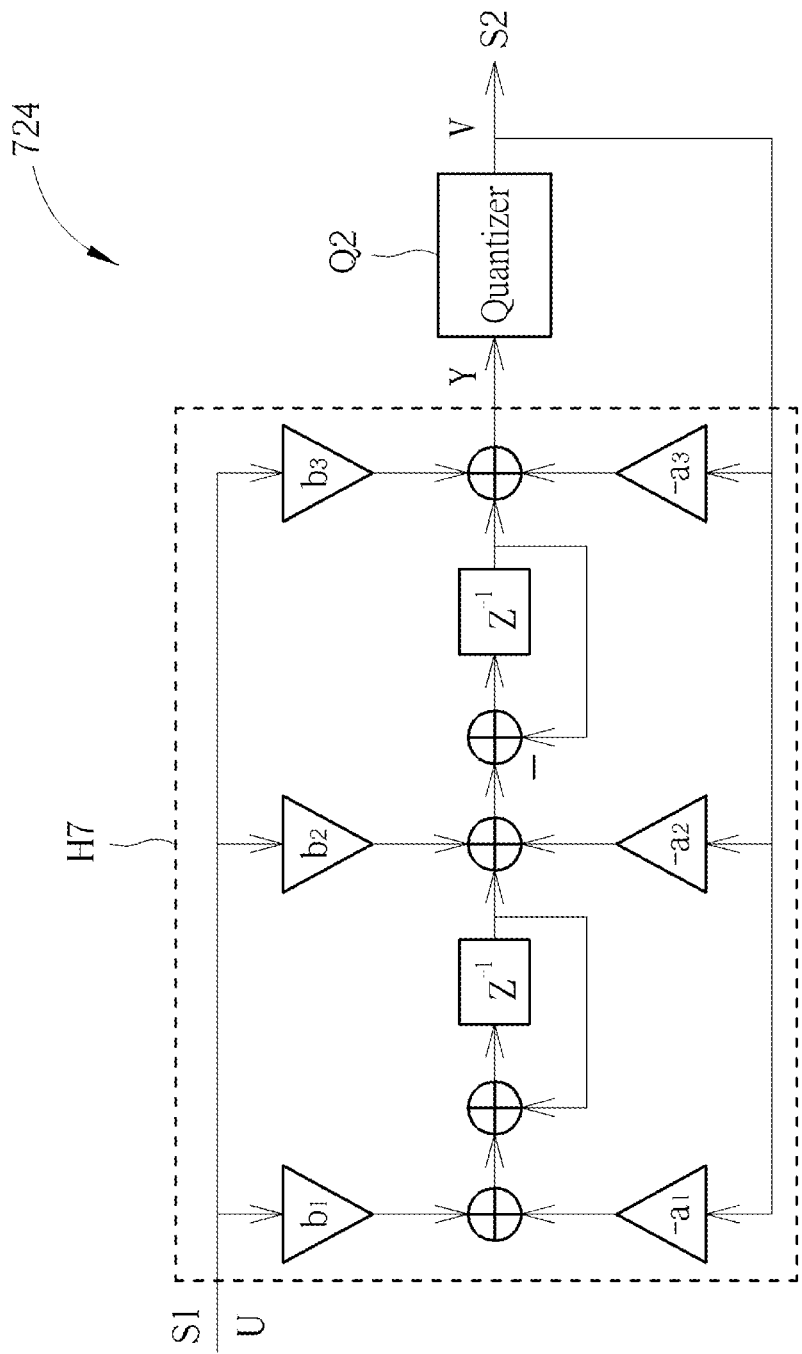
FIG. 7 is a schematic view of a sigma-delta modulator according to another embodiment of the present disclosure.

Moreover, reference is made to FIG. 7, which is a schematic view of a sigma-delta modulator 724 according to embodiments of the present disclosure. The sigma-delta modulator 724 may be used to implement the sigma-delta modulator 624 of the converting module 626, wherein the sigma-delta modulator 624 is coupled to an oversampling ADC 622 having a sampling rate greater than N times the Nyquist rate. The sigma-delta modulator 724 comprises a filter H7 and the $N_2$-bit quantizer Q2. In the embodiment illustrated in FIG. 7, the filter H7 is a second-order filter. Specifically, in one embodiment, the filter H7 may have a noise transfer function expressed as $$\frac{V(z)}{E(z)} = \frac{z^2 - 1}{z^2 + a_2 z + a_1 - a_2},$$

and have a signal transfer function expressed as $$\frac{Y(z)}{U(z)} = \frac{b_3 z^2 + b_2 z - b_3 - b_2 + b_1}{z^2 + a_2 z + a_1 - a_2},$$

wherein $a_1$, $a_2$, $b_1$, $b_2$ and $b_3$ are filter coefficients of the filter H7. Furthermore, in FIG. 7, the coefficient $a_3$ may be 0.

In view of the noise transfer function of the filter H7, the filter H7 has zeros at z=+1 and z=−1; that is, the zeros of the filter H7, relative to the sampling rate, are located at a low frequency and a high frequency. In this way, the filter H7 may effectively prevent the quantization noise of the quantizer Q2 from entering into the signal band, or prevent the quantization noise, which has been processed using the down-sampling operation, from entering the signal band. In addition, the filter coefficients $a_1$ and $a_2$ may be designed in such a way that a pole of the noise transfer function of the filter H7 is located in a band other than the signal band. Accordingly, the quantization noise of the quantizer Q2 can be located at the band other than the signal band. Furthermore, the filter coefficients $b_1$, $b_2$ and $b_3$ may be designed in such a way that a zero of the signal transfer function of the filter H7 is located at a high frequency outside the signal band. In this way, it is feasible to prevent the quantization noise, which is introduced by the oversampling ADC 622 and undergoes the down-sampling operation, from entering the signal band.

Figure 8:
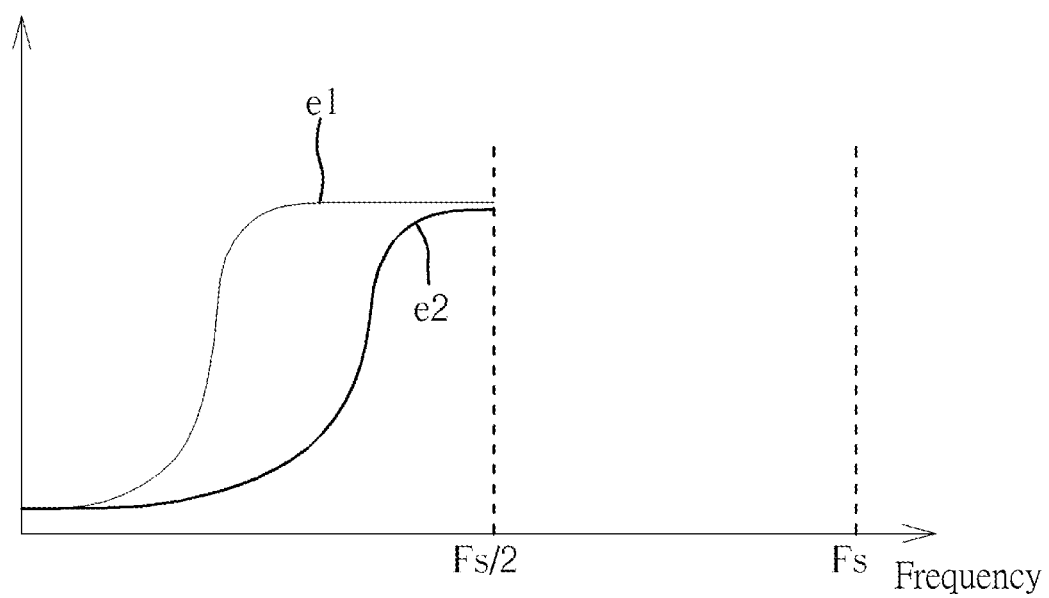
FIG. 8 is a schematic view of the noise frequency spectrum outputted by the converting module according to embodiments of the present disclosure.

Specifically, reference is directed to FIG. 8, which is a schematic view of the noise frequency spectrum outputted by the converting module according to embodiments of the present disclosure. In FIG. 8, the curve e1 represents the noise frequency spectrum outputted by a sigma-delta ADC having a sampling rate equal to a frequency Fs/2. In comparison, the curve e2 represents the noise frequency spectrum outputted by the converting module 626, wherein a sampling rate of the sigma-delta ADC 622 is equal to a frequency Fs, and the down-sampling rate M of the rate converter 623 is 2. In other words, a sampling rate of an output signal of the converting module 626 is also the frequency Fs/2. As can be observed from the curve e1 and the curve e2, within the band lower than the frequency Fs/2, the noise frequency spectrum corresponding to the sigma-delta ADC having the sampling rate Fs/2 is wider. In other words, with the use of the sigma-delta modulator 624 of the converting module 626 and the rate converter 623 coupled to the output terminal of the sigma-delta modulator 624, the noise energy entering into the signal band can be effectively reduced, thereby maintaining a better signal-to-noise ratio.

In view of the foregoing, the present disclosure uses the sigma-delta modulator to convert the bit width, and uses the rate converter to convert the bit rate, thereby solving the issue of inconsistent signal specifications in the prior art. Also, by properly designing the filter within the sigma-delta modulator to effectively suppress the noise, the present disclosure can effectively reduce the noise energy entering into the signal band, and maintain a better signal-to-noise ratio.

The detailed description sets forth only some of the embodiments of the present disclosure, and should not be construed to limit the scope of the present invention. Any modification, equivalent substitution and improvement within the spirits and principles of the present invention fall within the protection scope of the present disclosure.

What is claimed is:

1. A converting module, formed in a first die, the first die being coupled to a bus, the bus having a bus bit width, the converting module comprising:
   an analog-to-digital converter, configured to receive an analog signal and convert the analog signal to generate a first digital signal, wherein the first digital signal has a first bit width different from the bus bit width; and
   a sigma-delta modulator, coupled to the analog-to-digital converter, the sigma-delta modulator configured to generate a second digital signal according to the first digital signal converted from the analog signal by the analog-to-digital converter, wherein the second digital signal has a bit width equal to the bus bit width, the sigma-delta modulator comprises a filter and a quantizer, and a number of bits outputted by the quantizer is equal to the bus bit width.

2. The converting module of claim 1, wherein the first die is coupled to a second die through the bus.

3. The converting module of claim 1, wherein a sampling rate of the analog-to-digital converter is equal to a Nyquist rate, a noise transfer function of the filter is expressed as $$\frac{z^2 + (g-2)z + 1}{z^2 + (g-2+a_1+a_2)z + 1 - a_2},$$

a signal transfer function of the filter is expressed as $$\frac{b_3 z^2 + (gb_3 - 2b_3 + b_2 + b_1)z + (b_3 - b_2)}{z^2 + (g-2+a_1+a_2)z + 1 - a_2},$$

and $a_1$, $a_2$, $b_1$, $b_2$, $b_3$ and g are filter coefficients of the filter.

4. The converting module of claim 1, wherein a sampling rate of the analog-to-digital converter is greater than a Nyquist rate, a noise transfer function of the filter is expressed as $$\frac{z^2 - 1}{z^2 + a_2 z + a_1 - a_2},$$

a signal transfer function of the filter is expressed as $$\frac{b_3 z^2 + b_2 z - b_3 - b_2 + b_1}{z^2 + a_2 z + a_1 - a_2},$$

and $a_1$, $a_2$, $b_1$, $b_2$ and $b_3$ are filter coefficients of the filter.

5. The converting module of claim 1, further comprising a rate converter, wherein the rate converter is coupled to the sigma-delta modulator.

6. The converting module of claim 5, wherein the rate converter is coupled between the analog-to-digital converter and the sigma-delta modulator; the rate converter receives the first digital signal, and the first digital signal has a first bit rate; the rate converter converts the first digital signal into a third digital signal having a second bit rate, and the sigma-delta modulator receives the third digital signal and generates the second digital signal; the second digital signal has the second bit rate different from the first second bit rate.

7. The converting module of claim 5, wherein the sigma-delta modulator receives the first digital signal and generates the second digital signal; the rate converter is coupled between the sigma-delta modulator and the bus; the rate converter receives the second digital signal, and converts the second digital signal into a fourth digital signal; the second digital signal has a first bit rate, and the fourth digital signal has a second bit different from the first bit rate.

8. The converting module of claim 5, wherein the rate converter is an up-sampler.

9. The converting module of claim 5, wherein the rate converter is a down-sampler.

10. A converting circuit, comprising:
   a bus, having a bus bit width;
   a first die, fabricated by a first process; and
   a second die, fabricated by a second process, the bus being disposed between the first die and the second die, the second die arranged to receive an output signal outputted from the first die through the bus, the output signal having a bit width equal to a bus bit width of the bus disposed between the first die and the second die, wherein the first die comprises:

an analog-to-digital converter, configured to receive an analog signal and convert the analog signal to generate a first digital signal, wherein the first digital signal has a first bit width different from the bus bit width of the bus disposed between the first die and the second die; and a sigma-delta modulator, coupled between the analog-to-digital converter and the bus, the sigma-delta modulator configured to generate a second digital signal according to the first digital signal converted from the analog signal by the analog-to-digital converter, and send the second digital signal toward the bus, wherein the second digital signal has a bit width equal to the bus bit width of the bus disposed between the first die and the second die, the sigma-delta modulator comprises a filter and a quantizer, and a number of bits outputted by the quantizer is equal to the bus bit width.

11. The converting circuit of claim 10, wherein the first die further comprises an analog front-end module, configured to generate the DIM analog signal and send the analog signal to the analog-to-digital converter.

12. The converting circuit of claim 10, wherein the analog-to-digital converter has a sampling rate equal to a Nyquist rate, a noise transfer function of the filter is expressed as $$\frac{z^2 + (g-2)z + 1}{z^2 + (g-2+a_1+a_2)z + 1 - a_2},$$

a signal transfer function of the filter is expressed as $$\frac{b_3 z^2 + (gb_3 - 2b_3 + b_2 + b_1)z + (b_3 - b_2)}{z^2 + (g-2+a_1+a_2)z + 1 - a_2},$$

and $a_1$, $a_2$, $b_1$, $b_2$, $b_3$ and g are filter coefficients of the filter.

13. The converting circuit of claim 10, wherein the analog-to-digital converter has a sampling rate that is greater than a Nyquist rate, a noise transfer function of the filter is expressed as $$\frac{z^2 - 1}{z^2 + a_2 z + a_1 - a_2},$$

a signal transfer function of the filter is expressed as $$\frac{b_3 z^2 + b_2 z - b_3 - b_2 + b_1}{z^2 + a_2 z + a_1 - a_2},$$

and $a_1$, $a_2$, $b_1$, $b_2$ and $b_3$ are filter coefficients of the filter.

14. The converting circuit of claim 10, wherein the first die further comprises a rate converter, and the rate converter is coupled to the sigma-delta modulator.

15. The converting circuit of claim 14, wherein the rate converter is coupled between the analog-to-digital converter and the sigma-delta modulator; the rate converter receives the first digital signal, and the first digital signal has a first bit rate; the rate converter converts the first digital signal into a third digital signal having a second bit rate, and the sigma-delta modulator receives the third digital signal and generates the second digital signal having the second bit rate.

16. The converting circuit of claim 14, wherein the sigma-delta modulator receives the first digital signal and generates the second digital signal; the rate converter is coupled between the sigma-delta modulator and the bus; the rate converter receives the second digital signal, and converts the second digital signal having a first bit rate into a fourth digital signal having a second bit.

17. The converting circuit of claim 14, wherein the rate converter is an up-sampler.

18. The converting circuit of claim 14, wherein the rate converter is a down-sampler.

* * * * *